(12) United States Patent
Feldner et al.

(10) Patent No.: US 11,069,992 B2
(45) Date of Patent: Jul. 20, 2021

(54) CONNECTOR PART COMPRISING A CIRCUIT BOARD

(71) Applicant: Phoenix Contact E-Mobility GmbH, Schieder-Schwalenberg (DE)

(72) Inventors: Ralf Feldner, Horn-Bad Meinberg (DE); Carsten Garth, Lemgo (DE); Tanja Gebhardt, Schlangen (DE)

(73) Assignee: PHOENIX CONTACT E-MOBILITY GMBH, Schieder-Schwalenberg (DE)

( * ) Notice: Subject to any disclaimer, the term of this patent is extended or adjusted under 35 U.S.C. 154(b) by 0 days.

(21) Appl. No.: 16/705,258

(22) Filed: Dec. 6, 2019

(65) Prior Publication Data
US 2020/0185847 A1  Jun. 11, 2020

(30) Foreign Application Priority Data

Dec. 10, 2018 (BE) .................................. 2018/5869

(51) Int. Cl.
*H01R 12/00* (2006.01)
*H01R 12/58* (2011.01)
(Continued)

(52) U.S. Cl.
CPC ............ *H01R 12/585* (2013.01); *B60L 53/16* (2019.02); *H01R 13/50* (2013.01);
(Continued)

(58) Field of Classification Search
CPC .. H01R 12/585; H01R 13/50; H01R 13/6616; H01R 13/6683; H01R 2201/26;
(Continued)

(56) References Cited

U.S. PATENT DOCUMENTS 5,035,650 A * 7/1991 Defibaugh ......... H01R 13/6582
439/607.17
6,799,984 B2 * 10/2004 Starta ................... H01R 13/527
439/139
(Continued)

FOREIGN PATENT DOCUMENTS

CN    105556754 A    5/2016
CN    207925703 U    9/2018
(Continued)

*Primary Examiner* — Abdullah A Riyami
*Assistant Examiner* — Vladimir Imas
(74) *Attorney, Agent, or Firm* — Leydig, Voit & Mayer, Ltd.

(57) ABSTRACT

A connector part for connecting in a plug-in manner to an associated mating connector part includes: a housing part; a plug-in face which is formed on the housing part and by which the connector part is connectable, in a plug-in manner, to the mating connector part and on which a plurality of contact elements for electrically connecting to the mating connector part is arranged; and a circuit board, on which at least one electrical or electronic functional component is arranged, the circuit board having a first opening through which a first contact element of the plurality of contact elements extends, the circuit board comprising at least one first contact spring for the thermal and/or electrical contact with the first contact element and at least one second contact spring for the thermal and/or electrical contact with a second contact element of the plurality of contact elements.

15 Claims, 7 Drawing Sheets

(51) Int. Cl.
  *B60L 53/16*  (2019.01)
  *H01R 13/50*  (2006.01)
  *H01R 13/66*  (2006.01)
  *H05K 1/18*   (2006.01)
  *B60L 53/18*  (2019.01)

(52) U.S. Cl.
  CPC ..... *H01R 13/6616* (2013.01); *H01R 13/6683* (2013.01); *H05K 1/18* (2013.01); *B60L 53/18* (2019.02); *H01R 2201/26* (2013.01); *H05K 2201/09027* (2013.01); *H05K 2201/10022* (2013.01); *H05K 2201/10151* (2013.01)

(58) Field of Classification Search
  CPC .......... H05K 1/18; H05K 2201/09027; H05K 2201/10022; H05K 2201/10151; B60L 53/16; B60L 53/18
  USPC .......................................................... 439/82
  See application file for complete search history.

(56) References Cited

U.S. PATENT DOCUMENTS

| | | | | |
|---|---|---|---|---|
| 6,905,362 B2 * | 6/2005 | Williams | ............ | H01M 2/1083 439/490 |
| 7,588,466 B2 * | 9/2009 | Blasko | ............... | H01R 13/6658 439/620.09 |
| 8,016,607 B2 * | 9/2011 | Brown, II | ............... | H01R 13/53 439/353 |
| 8,545,237 B2 * | 10/2013 | Johnson | ............... | H01R 12/585 439/75 |
| 8,573,994 B2 * | 11/2013 | Kiko | ....................... | B60L 53/65 439/188 |
| 8,729,856 B2 * | 5/2014 | Nathan | ............... | H01R 13/6683 320/109 |
| 8,934,263 B2 * | 1/2015 | Eckhardt | ............. | G01L 19/0654 361/796 |
| 9,130,317 B2 * | 9/2015 | Wang | ................ | H01R 13/6205 |
| 9,197,010 B2 * | 11/2015 | Greig | ................ | B64D 11/0624 |
| 9,634,415 B2 | 4/2017 | Cox et al. | | |
| 9,812,799 B2 * | 11/2017 | Wittig | ................. | H01R 13/502 |
| 9,867,941 B2 * | 1/2018 | McLoughlin | ........... | A61M 5/20 |
| 9,919,609 B2 * | 3/2018 | Kretschmer | ....... | H01R 13/6683 |
| 10,326,236 B1 * | 6/2019 | Harmelink | ........... | H01R 12/716 |
| 10,530,101 B2 * | 1/2020 | Rose | ........................ | B60L 3/00 |
| 10,547,131 B2 * | 1/2020 | Feldner | ................. | H05K 1/119 |
| 10,581,193 B2 * | 3/2020 | Garcia | ............... | H01R 13/5208 |
| 10,665,995 B2 * | 5/2020 | Strong | ................... | H01R 13/71 |
| 2016/0233622 A1 | 8/2016 | Feldner | | |
| 2018/0097316 A1 | 4/2018 | Rose et al. | | |
| 2019/0260146 A1 * | 8/2019 | Feldner | ................. | H01R 27/02 |
| 2020/0279706 A1 * | 9/2020 | Gengenbach | .......... | H01H 37/54 |
| 2020/0290468 A1 * | 9/2020 | Moseke | ................ | B60L 53/16 |

FOREIGN PATENT DOCUMENTS

| | | |
|---|---|---|
| DE | 102010053074 A1 | 8/2011 |
| DE | 202012100613 U1 | 5/2012 |
| DE | 102013110548 A1 | 3/2015 |
| DE | 102015106251 A1 | 10/2016 |
| DE | 202017105818 U1 | 11/2017 |
| DE | 102016211876 A1 | 1/2018 |

* cited by examiner

CONNECTOR PART COMPRISING A CIRCUIT BOARD

CROSS-REFERENCE TO PRIOR APPLICATION

Priority is claimed to Belgian Patent Application No. BE 2018/5869, filed on Dec. 10, 2018, the entire disclosure of which is hereby incorporated by reference herein.

FIELD

The invention relates to a connector part for connecting, in a plug-in manner, to a mating connector part.

BACKGROUND

Such a connector part comprises a housing part, a plug-in face which is formed on the housing part and by way of which the connector part can be connected, in a plug-in manner, to the mating connector part and on which a plurality of contact elements for electrically connecting to the mating connector part are arranged, and a circuit board on which at least one electrical or electronic functional component is arranged.

Such a connector part can be a male or a female connector part, for example. Such a connector part can be used in particular on a charging device for transmitting a charging current. The connector part can in particular be designed as a charging plug or charging socket for charging an electric motor-driven motor vehicle (also referred to as an electric vehicle) and can be used on the side of a charging station, e.g. as a charging plug on a charging cable, or on the side of a vehicle as a so-called inlet.

Charging plugs or charging sockets for charging electric vehicles are to be designed in such a way that large charging currents can be transmitted. Since the thermal dissipation increases quadratically with the charging current and in addition it is prescribed that a temperature increase at a connector part must not exceed 50 K, it is necessary with such charging plugs or charging sockets to provide temperature monitoring in order to detect an overheating at components of the charging plug or charging socket at an early stage and, if necessary, to modify the charging current or even switch off the charging device. For example, in a connector part known from DE 10 2015 106 251 A1, contact elements are arranged, for example, in openings in a circuit board. One or more sensor devices are provided on the circuit board and serve to detect heating at one or more contact elements.

So as to additionally ensure, when an electric vehicle is connected to a charging station via a charging cable, that a charging current fed into the electric vehicle does not exceed a permissible maximum amperage for which the charging cable and a charging system of the electric vehicle are designed, resistor codings are used on connector parts, as is described, for example, in DE 10 2010 053 074 A1, DE 20 2012 100 613 U1 and DE 10 2013 110 548 A1 and is also standardized in relevant standards, for example IEC 62196. For example, a resistor can be connected in a plug of a charging cable between a so-called proximity contact and a protective ground conductor contact, the resistance value of which can be measured via a charging station when the plug is connected to the charging station in order to detect the type of charging cable connected based on the resistance value. Specific types of charging cables or charging devices are associated with different resistance values so that this type can be identified based on the resistance value. In particular, a permissible maximum amperage, which can be transmitted, for example, via a charging cable (for example 16 A or 32 A), can be identified in this way so that the charging station can accordingly limit a fed current. A resistor coding is used, for example, for a similar purpose on a connector part in the form of a charging socket on an electric vehicle. In this case, a maximum permissible charging current, for which the charging system of the electric vehicle is designed, can in particular be identified based on a resistance value.

So as to provide various electrical and/or electronic functions, for example temperature monitoring or resistor coding, on a connector part, it has conventionally already been provided to arrange a circuit board comprising functional components arranged thereon in a connector part. In this case, a space-efficient arrangement of the circuit board in the connector part is desirable, with reliable thermal and/or electrical contacting with associated contact elements and simple mounting of the connector part.

SUMMARY

In an embodiment, the present invention provides a connector part for connecting, in a plug-in manner, to an associated mating connector part, comprising: a housing part; a plug-in face which is formed on the housing part and by which the connector part is connectable, in a plug-in manner, to the mating connector part and on which a plurality of contact elements configured to electrically connect to the mating connector part is arranged; and a circuit board, on which at least one electrical or electronic functional component is arranged, the circuit board having a first opening through which a first contact element of the plurality of contact elements extends, the circuit board comprising at least one first contact spring for the thermal and/or electrical contact with the first contact element and at least one second contact spring for the thermal and/or electrical contact with a second contact element of the plurality of contact elements.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
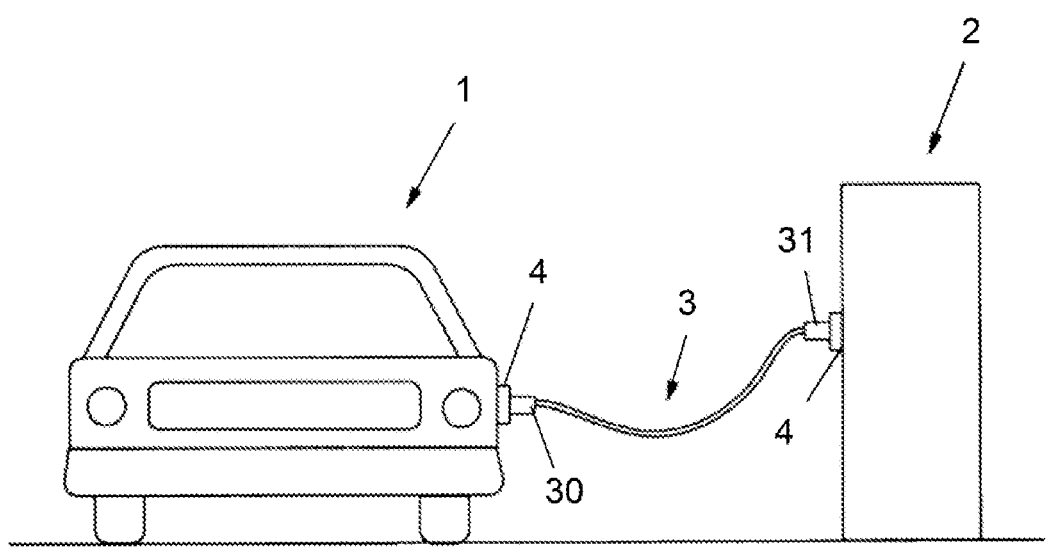
FIG. 1 a schematic representation of an electric vehicle with a charging cable and a charging station for charging.
Figure 2:
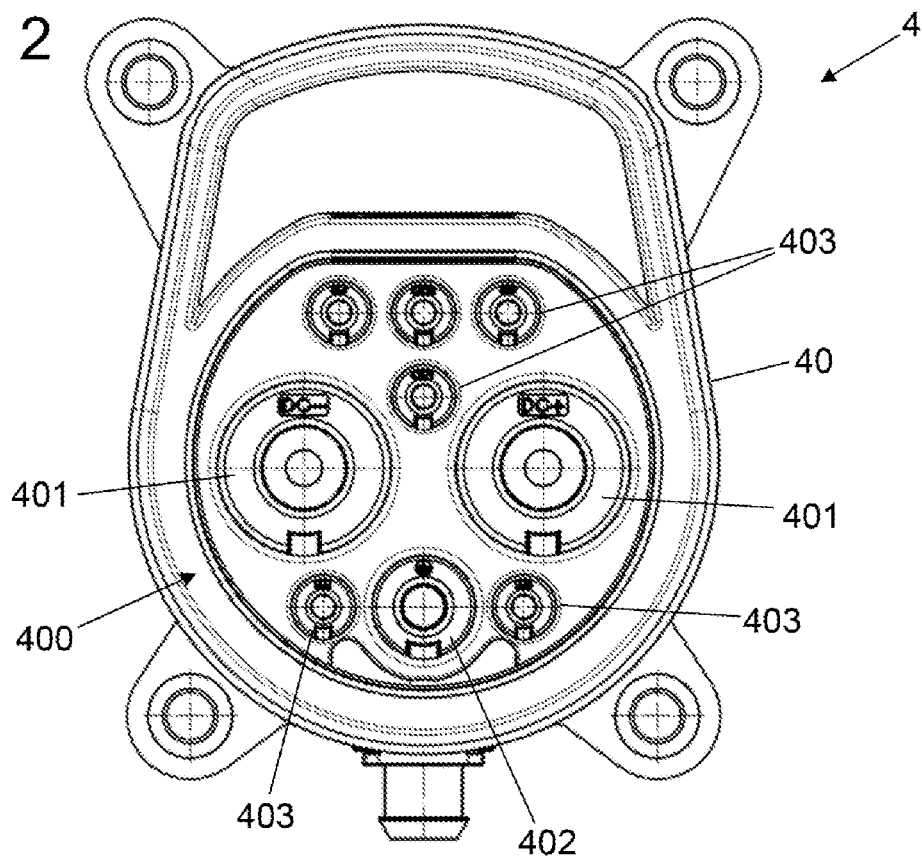
FIG. 2 a view of a connector part in the form of an inlet on the part of a vehicle.
Figure 3:
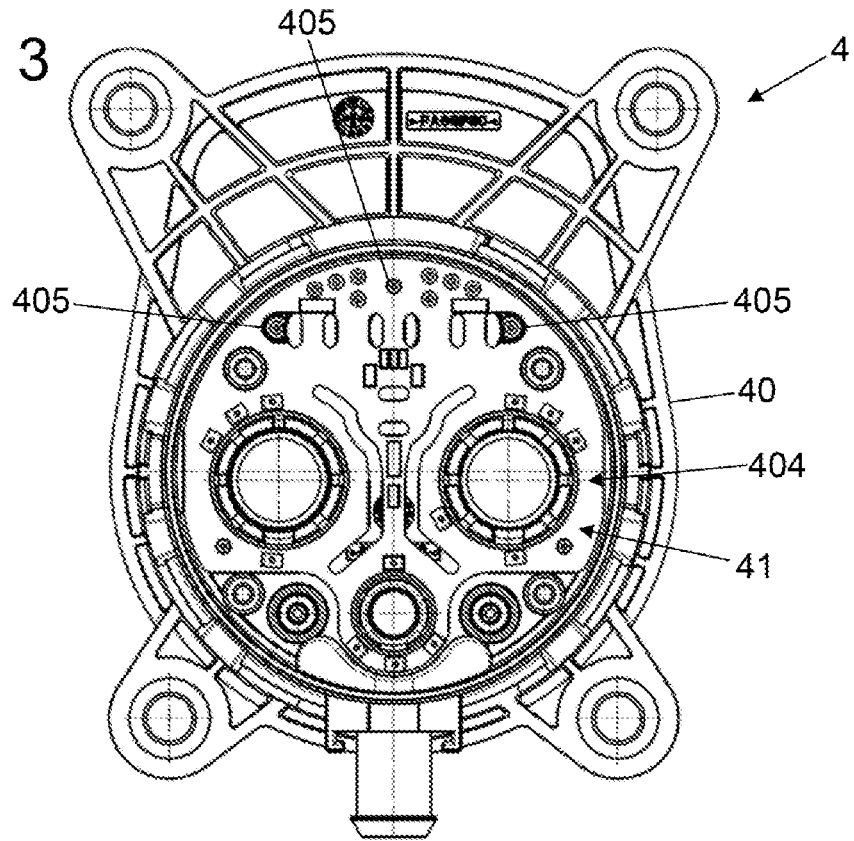
FIG. 3 a rear view of the connector part.
Figure 4:
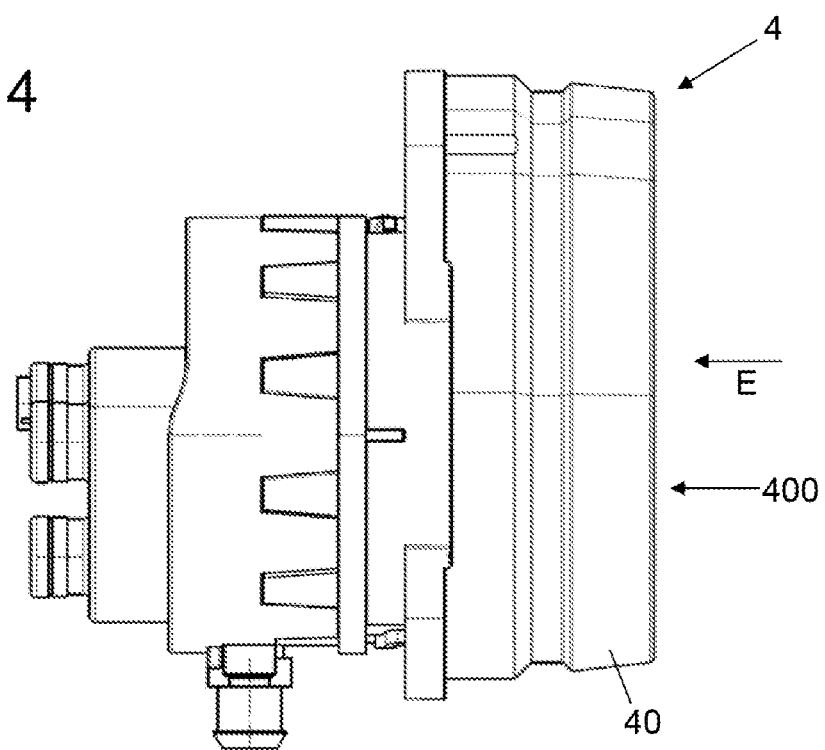
FIG. 4 a side view of the connector part.
Figure 5:
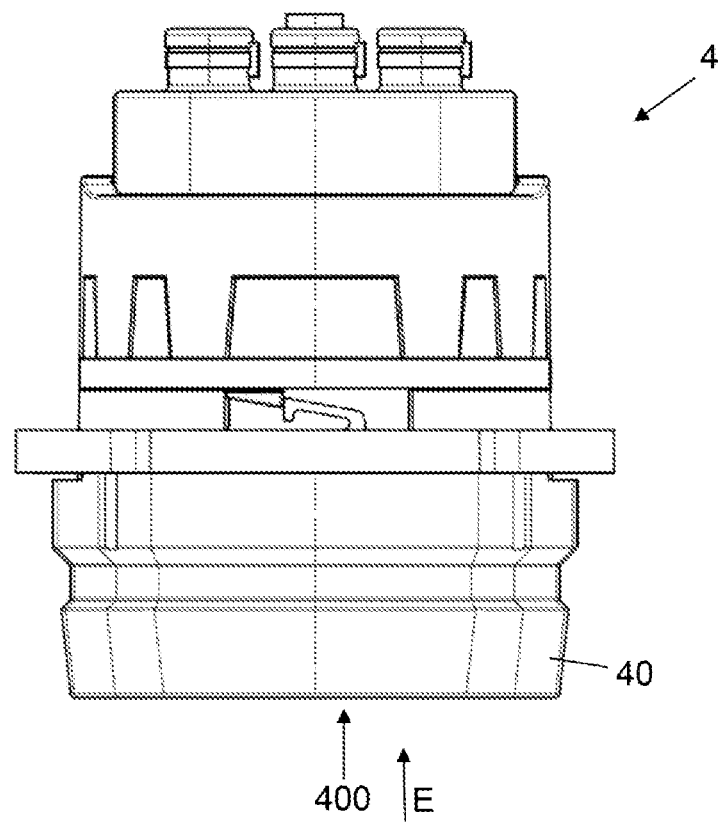
FIG. 5 a top view of the connector part.
Figure 6:
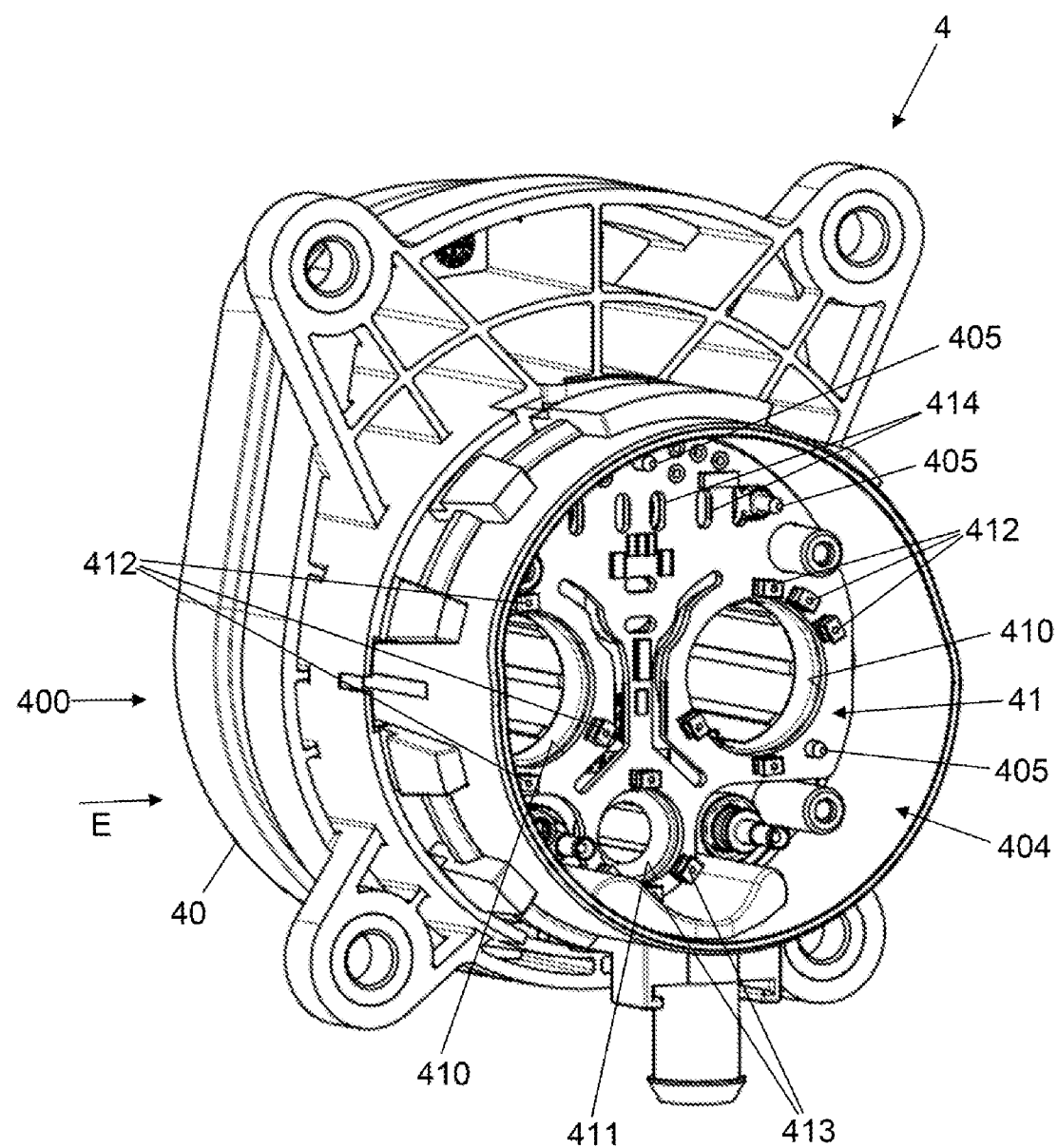
FIG. 6 a view of the connector part obliquely from the rear.
Figure 7:
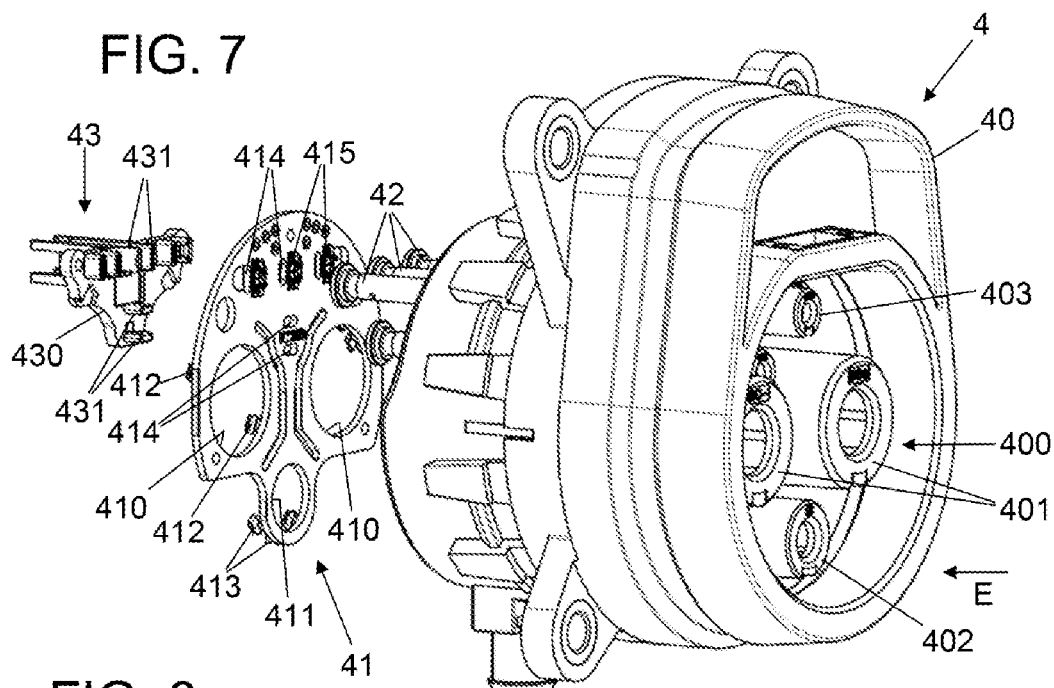
FIG. 7 a partial exploded view of the connector part obliquely from the front.
Figure 8:
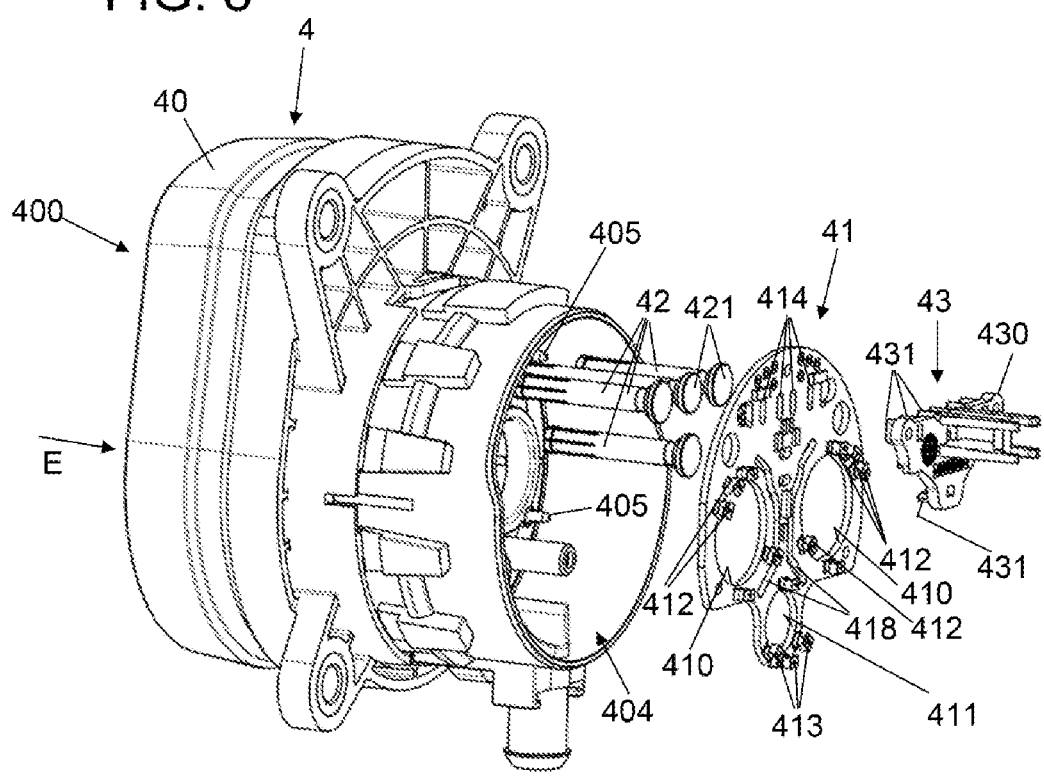
FIG. 8 a partial exploded view of the connector part obliquely from the rear.
Figure 9:
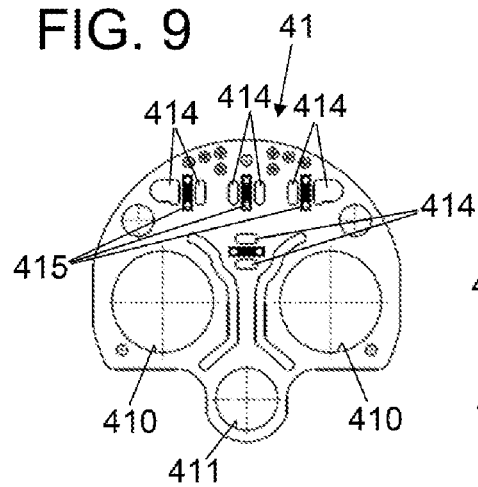
FIG. 9 a front view of a circuit board accommodated in a housing part of the connector part.
Figure 10:
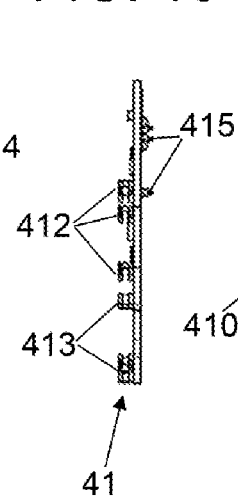
FIG. 10 a side view of the circuit board.
Figure 11:
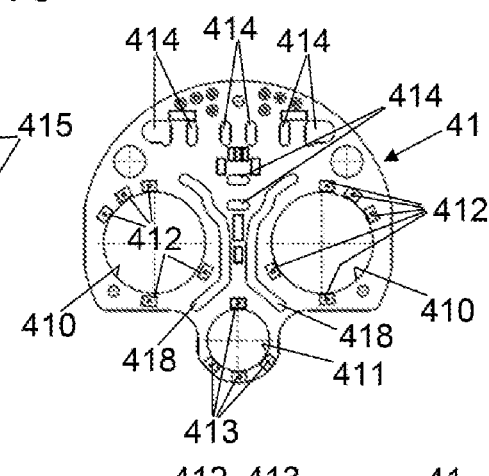
FIG. 11 a rear view of the circuit board.
Figure 12:
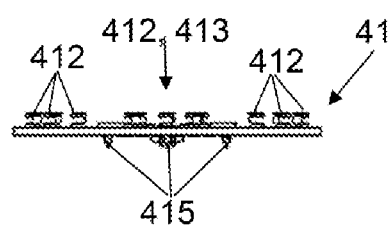
FIG. 12 a top view of the circuit board.

In an embodiment, the present invention provides a connector part that enables a space-saving arrangement of a circuit board, with advantageous thermal and/or electrical contacting with associated contact elements and, additionally, with simple mounting of the circuit board in the connector part.

Accordingly, the circuit board has a first opening through which a first contact element of the plurality of contact elements extends, wherein the circuit board has at least one first contact spring for the thermal and/or electrical contact with the first contact element or at least one second contact spring for the thermal and/or electrical contact with a second contact element of the plurality of contact elements.

The circuit board is used to provide electrical and/or electronic functions on the connector part. In particular, temperature monitoring can be provided at load contacts of the connector part. In addition, resistor coding can be implemented, for example, by way of the circuit board. The contact elements of the connector part extend, for example, axially along a plug-in direction along which the connector part is to be connected to the associated mating connector part. Since a first contact element passes through an opening of the circuit board, the circuit board can preferably extend approximately perpendicularly to the plug-in direction, and thus perpendicularly to the longitudinal extension direction of the contact elements, which makes it possible to efficiently enclose, in terms of installation space, the circuit board in the housing part of the connector part.

Reliable, easy-to-establish contacting is provided via the contact springs arranged on the circuit board, for thermally and/or electrically coupling the contact elements to the circuit board. During the assembly of the connector part, the associated contact elements automatically bear against associated contact springs of the circuit board, whereby thermal and/or electrical coupling of the contact elements to the circuit board is provided, without the need to take further measures for coupling the circuit board to the contact elements. The contact springs can be designed, for example, as surface-mounted (for example SMD-soldered) spring elements, which automatically bear against the associated contact elements under elastic stress when the connector part is mounted.

This results in simple mounting, with the circuit board being efficiently accommodated, in terms of the installation space, in the housing part of the connector part and, in addition, with the circuit board being reliably thermally and/or electrically contacted with associated contact elements.

In one embodiment, the at least one first contact spring and the at least one second contact spring are arranged on different sides of the circuit board. On a first side, the circuit board can, for example, comprise one or more first contact springs for contacting with the associated first contact element, for example a load contact. On a second side facing away from the first side, in contrast, the circuit board comprises one or more second contact springs for contacting with the second contact element, for example a signal contact. A plurality of groups of first contact springs and second contact springs can be arranged on the circuit board in the process and are used for contacting with a plurality of first contact elements, for example a plurality of load contacts, and a plurality of second contact elements, for example a plurality of signal contacts. The contact springs are spring-loaded axially, that is to say perpendicularly to the plane of the circuit board, and thus bear against the associated contact elements under axial stress during the assembly of the connector part.

In one embodiment, the first contact element comprises a shank section passing through the first opening of the circuit board and a collar arranged on the shank section. The collar protrudes radially from the shank section and, via the at least one first contact spring, contacts the circuit board thermally and/or electrically in such a way that a thermal and/or electrical coupling of the contact element to the circuit board is established via the collar. On the one hand, a contact section, for example in the form of a socket section for implementing a contact socket, for electrically contacting with an associated mating contact element of a mating connector part, which protrudes into the plug-in face, can, for example, adjoin the shank section. On the other hand, a connection end can be arranged on the shank section, via which connection end a line can be connected to the contact element, for example a load line for conducting a load current to the first contact element.

If the at least one first contact spring bears against the collar of the first contact element, the circuit board can preferably be supported axially between the collar and the second contact element and thus, at least during assembly, be held in position in an axially floating manner. The circuit board is elastically resiliently supported, for example, toward one end of the second contact element by way of the at least one second contact spring. The circuit board is thus elastically held between the collar of the first contact element and the second contact element, which makes the mounting of the circuit board in the housing part of the connector part insensitive to tolerances and, for example, enables the use of circuit boards of different thicknesses without structural adaptation of other components of the connector part.

After arrangement on the housing part (and initial support in an axially floating manner), it is possible in the process to fix the circuit board axially to the housing part, for example by securing fastening domes arranged on the circuit board or on the housing part.

The first contact element can, for example, realize a load contact for operating a load current, for example a charging current for charging an electric vehicle. Since heating can occur at such a load contact during operation of the connector part, temperature monitoring is preferably provided on the first contact element and is made possible by thermally connecting the first contact element to the circuit board via the at least one first contact spring so that heat can be conducted from the first contact element to the circuit board and to a temperature sensor arranged on the circuit board so as to detect heating at the first contact element via the temperature sensor.

The circuit board can comprise a control device, for example, to which sensor signals of the temperature sensor are fed, wherein the control device can be designed to evaluate the sensor signals and, if necessary, to initiate suitable counter measures (for example interrupt a charging process) if (excessive) heating is detected at the first contact element.

Such a temperature sensor can be formed by a temperature-dependent resistor, for example. Such a temperature sensor can, for example, be a resistor having a positive temperature coefficient (so-called PTC resistor), the resistance value of which rises as the temperature increases (also referred to as a PTC thermistor, which has good electrical conductivity at low temperatures and reduced electrical conductivity at higher temperatures). Such a temperature sensor can, for example, also have a non-linear temperature characteristic curve and can be produced, for example, from a ceramic material (so-called ceramic PTC thermistor).

As an alternative, for example, it is also possible to use as the temperature sensor an electrical resistor having a negative temperature coefficient (so-called NTC resistors), the resistance value of which decreases with increasing temperature.

Alternatively or additionally, a temperature sensor formed by a semiconductor component can also be used.

In one embodiment, the second contact element implements a signal contact for transmitting or detecting control signals. In the case of a connector part within the scope of a charging system for charging an electric vehicle, control signals which control a charging process and via which, for example, control signals are exchanged between a vehicle and a charging station can, for example, be transmitted via such signal contacts. Electrical signals of low voltage and low amperage are thus transmitted via such a signal contact in order to exchange information and control commands. In particular, electrical coupling can take place via the at least one second contact spring, for example in order to provide resistor coding. Using such resistor coding, for example, the type of a connected charging cable or a charging station or a permissible maximum amperage can be identified based on the resistance value of an electrical resistor.

Additionally or alternatively, a connecting line can also be connected to the second contact element via the at least one second contact spring. In this case, the connecting line is connected to the circuit board and electrically coupled to the second contact element via the at least one second contact spring. A direct connection of the connecting line to the second contact element, for example by crimping, is not required in this case, which considerably simplifies the assembly of the connector part.

In general, connecting lines can be routed via the circuit board for such contact elements of the connector part that do not transmit load currents, which makes it possible to create a preassembled structural unit, within the scope of which connecting lines are connected to the circuit board and coupling with associated contact elements then takes place by way of contact springs on the circuit board. This can significantly simplify the manufacture of the connector part.

In one embodiment, the circuit board has a second opening through which a third contact element extends, wherein the circuit board comprises at least one third contact spring for the thermal and/or electrical contact with the third contact element. The third contact element can be a ground contact (so-called PE contact), for example, via which grounding at the connector part is made available. The third contact element can be, in particular electrically, connected to the circuit board in the process via one or more third contact springs, wherein the third contact element is connected to the second contact element by way of the circuit board and an electrical resistor arranged on the circuit board, so as to, in this way, provide resistor coding at the connector part by an electrical resistor connected between the third contact element and the second contact element.

In one embodiment, the connector part comprises a signal contact carrier, which passes through the circuit board at a first flow opening so as to fix the second contact element on the housing part. The signal contact carrier is used, in particular, to hold the second contact element, which, for example, implements a signal contact, axially in position on the housing part so that the second contact element is fixed to the plug-in face in a fixed position. For this purpose, the signal contraction carrier can be attached, for example, to a side of the circuit board facing away from the second contact element and, with a fixing element, passes through an associated through-opening on the circuit board, so as to act on the second contact element and fix the latter by way of the fixing element. The signal contact carrier is connected to the housing part and secured in relation to the housing part by way of another housing assembly, for example, so that one or more second contact elements are fixed in relation to the housing part by way of the signal contact carrier.

In one embodiment, the connector part additionally comprises a load contact carrier, which is connected to the housing part and on which one or more first contact elements, in particular in the form of load contacts, are arranged. The load contact carrier can mechanically fix the first contact elements in the form of the load contacts in the process, and thus fix these in relation to the housing part, wherein the load contact carrier, for example, passes through the circuit board and thus mounts the circuit board.

The connector part can be used, for example, as a charging plug or as a charging socket of a charging system for charging an electric vehicle. For this purpose, the connector part has contact elements which serve as load contacts for transmitting a charging current, for example in the form of a direct current or in the form of an alternating current.

FIG. 1 shows in a schematic view a vehicle 1 in the form of an electric motor-driven vehicle (also referred to as an electric vehicle). The electric vehicle 1 has electrically chargeable batteries via which an electric motor for moving the vehicle 1 can be electrically supplied.

In order to charge the batteries of the vehicle 1, the vehicle 1 can be connected to a charging station 2 via a charging cable 3. For this purpose, the charging cable 3 can be plugged with a charging plug 30 at one end into an associated connector part 4 in the form of a charging socket of the vehicle 1, and is electrically connected at its other end via another charging plug 31 to a connector part 4 in the form of a charging socket at the charging station 2. Charging currents with comparatively high amperage are transmitted to vehicle 1 via the charging cable 3.

FIGS. 2 to 16 show an exemplary embodiment of a connector part 4 in the form of a charging socket, for example, on the part of a vehicle (also referred to as a vehicle inlet), which can be connected, in a plug-in manner, to an associated mating connector part 30 in the form of a charging plug on a charging cable 3 so as to connect the electric vehicle 1 to the charging station 2 of the charging system. The connector part 4 comprises a housing part 40 on which a plug-in face 400 is formed, to which the mating connector part 30 can be connected, in a plug-in manner, along a plug-in direction E.

The plug-in face 400 is formed by plug-in domes 401, 402, 403, in which contact elements 42, 45, 46, 47 are arranged and by way of which the connector part 4 can be connected, in a plug-in manner, along the plug-in direction E to an associated mating connector part 30. In a connected state, a mechanically pluggable connection to the mating connector part 30 is established via the plug-in domes 401, 402, 403 of the plug-in face 400, with electrical contacting of the contact elements 42, 45, 46, 47 with associated mating contact elements of the mating connector part 30.

The plug-in face 400 is formed on a front side of the housing part 40. On a rear side facing away from the plug-in face 400, the housing part 40 has a receiving space 404 (see for example FIG. 6), in which a circuit board 41 having electrical and/or electronic functional components arranged thereon is accommodated and via which the electrical contact elements 42, 45, 46, 47 are arranged in the plug-in domes 401, 402, 403 of the plug-in face 400.

The circuit board 41 extends within the receiving space 404 along a plane oriented perpendicularly to the plug-in direction E. The circuit board 41 is thus oriented perpendicularly to the longitudinal extension direction of the contact elements 42, 45, 46, 47 so that the circuit board 41 is accommodated in the receiving space 404 of the housing part 40 in a space-efficient manner.

The circuit board 41 has two first openings 410 through which contact elements 45 in the form of load contacts pass in such a way that the contact elements 45 with contact sections 450 in the form of socket sections (see FIGS. 15 and 16) come to be located in the plug-in domes 401 of the plug-in face 400. A collar 452 protruding radially from a shank section 451 of the respective contact element 42 comes to be located on a side of the circuit board 41 facing away from the plug-in domes 401, and a connection end 453 adjoining the collar 452 is located in the receiving space 404 so that the respective contact element 45 can be connected to an associated load line by way of the connection end 453.

The circuit board 41 also has an opening 411, which is arranged centrally below the openings 410 and through which a contact element 46 in the form of a ground contact (so-called PE contact) passes in such a way that the contact element 46 projects into an associated plug-in dome 402 of the plug-in face 400. A collar of the contact element 46, which is designed analogously to the collar 452, comes to be located on the side of the circuit board 41 facing away from the plug-in dome 402 so that the contact element 46 can be connected to an associated grounding line within the receiving space 404.

In addition, contact elements 42 in the form of signal contacts are located in plug-in domes 403 above the plug-in domes 401 associated with the contact elements 42 in the form of the load contacts and cooperate with the circuit board 41.

Contact springs 412, 413, 415 for the thermal and/or electrical contact with the contact elements 42, 45, 46 are arranged on the circuit board 41. The contact springs 412, 413, 415 are designed, for example, as surface-mounted spring elements (for example SMD-soldered spring elements) and protrude axially to different sides from the circuit board 41.

Figure 13:
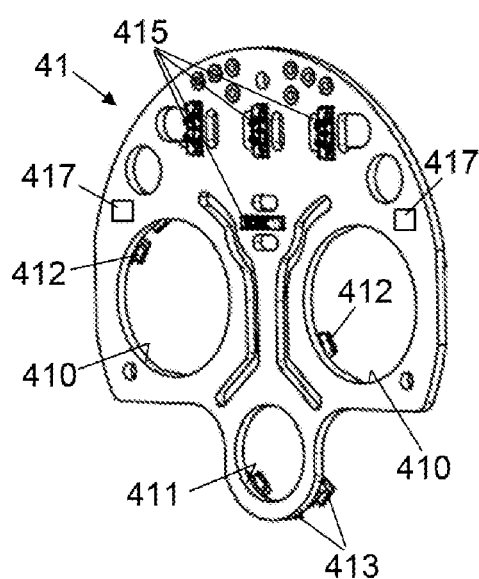
FIG. 13 a view of the circuit board obliquely from the front.

Two first groups of contact springs 412 are thus grouped around the first openings 410 and are used to thermally contact a collar 452 on a shank section 451 of a respectively associated contact element 45 in the form of a load contact so that the contact elements 45 in the form of the load contacts are thermally connected to the circuit board 41 via the contact springs 412, and heat can be conducted via the contact springs 412 to the circuit board 41, and thus to a temperature sensor 417 arranged on the circuit board 41 (see FIG. 13). Via the circuit board 41, temperature monitoring can thus be provided on the contact elements 45 in the form of the load contacts.

The contact elements 45 in the form of the load contacts are arranged on a load contact carrier 44 and are mechanically secured in relation to the housing part 40 via the load contact carrier 44 and are thus held in position relative to the housing part 40. The contact elements 45 each engage with the collar 452 thereof in an associated semicircular receiving groove 441 on a receiving device 440 of the load contact carrier 44 so that the respective contact element 45 passes through the associated opening 410 of the circuit board 41, and the connection end 453 facing away from the contact section 54 comes to be located in the region of the connection device 440. The contact springs 412, which are grouped around the opening 410 associated with a respective contact element 45, are located in a region outside the receiving groove 441 as viewed in the circumferential direction around the respective opening 410 or engage in a recess 442 in the region of the receiving groove 441 (see FIG. 16) so as to thermally contact the collar 452 of the respective contact element 45.

Contact springs 413 are grouped around the opening 411 and are used to electrically contact a contact element 46 in the form of a ground contact. The contact element 46 extends through the opening 411, rests with the radially protruding collar thereof against the associated contact springs 413 and is thus electrically connected to the circuit board 41.

Contact springs 415, which are associated with the contact elements 42 in the form of the signal contacts and which are each arranged between a pair of through-openings 414 through which a signal contact carrier 43 comprising fixing elements 431 passes (see FIGS. 9 and 11 in conjunction with FIGS. 7 and 8), are arranged on a side of the circuit board 41 facing away from the contact springs 412, 413. The signal contact carrier 43 is attached with a surface section 430 to the side of the circuit board 41 facing away from the signal contacts 42 and passes with the fixing elements 431 through the through-openings 414 of the circuit board 41 in such a way that the contact elements 42 in the form of signal contacts are held axially in position in the plug-in domes 403 of the plug-in face 400 by way of the fixing elements 431. For this purpose, the fixing elements 431 act on ends 421 of the contact elements 42 in the form of the signal contacts and thus secure these axially in the plug-in domes 43.

The contact elements 42 in the form of the signal contacts are electrically connected to the circuit board 41 via the contact springs 415. Resistor coding is provided on the connector part 4 via the circuit board 41 by connecting an electrical resistor 416 (see FIG. 14) between the contact elements 42, 46 by way of the electrical contacting of one of the contact elements 42 in the form of the signal contacts and the contact element 46 in the form of the ground contact, for example between a contact element 42 designed as a proximity contact and the contact element 46 in the form of the ground contact.

Figure 14:
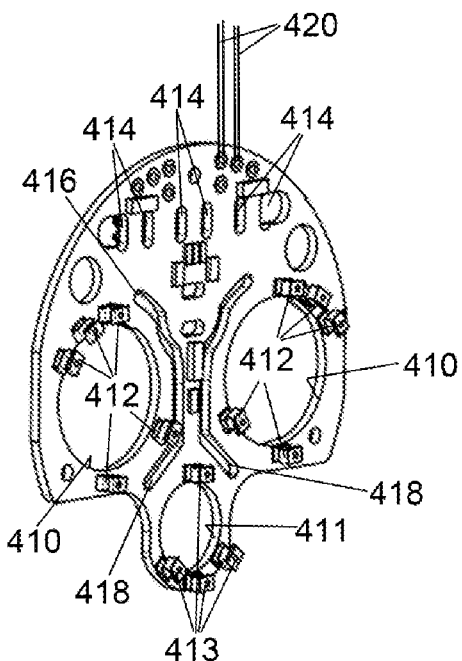
FIG. 14 a view of the circuit board obliquely from the rear.
Figure 15:
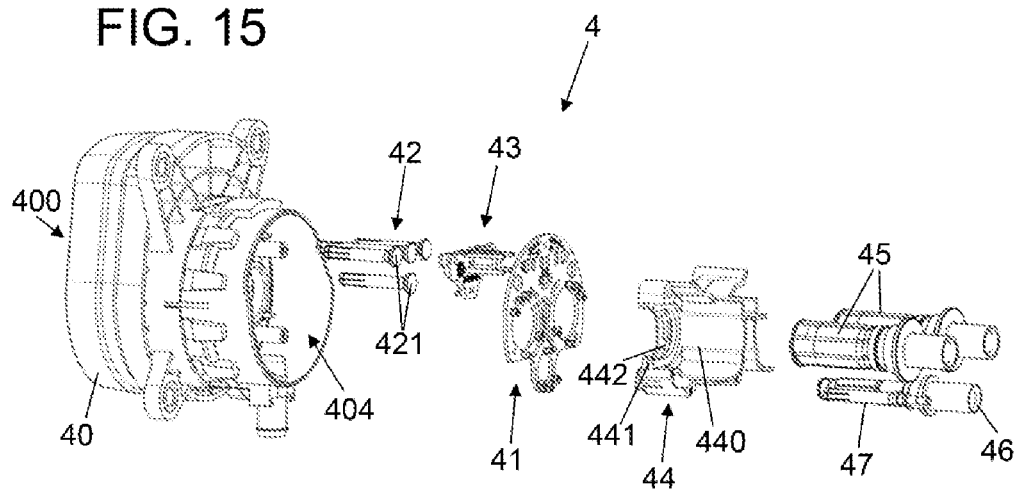
FIG. 15 an exploded view of the connector part.
Figure 16:
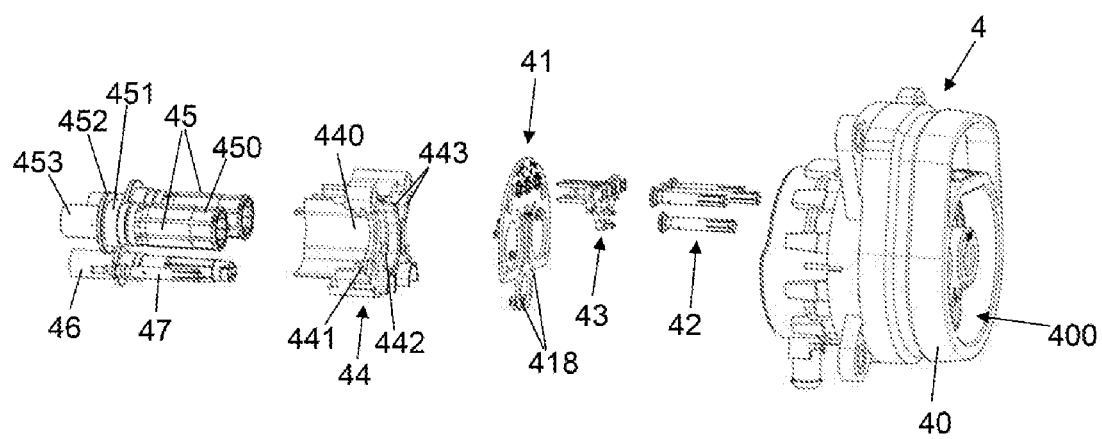
FIG. 16 an exploded view of the connector part obliquely from the front.

In addition, connecting lines 420, by way of which the contact elements 42 are electrically connected to a higher-level assembly, for example a higher-level control device, can be connected to the circuit board 41 (see FIG. 14). Connecting lines 420 can thus be routed via the circuit board 41, which makes a direct connection of the connecting lines 420 to the associated contact elements 42 superfluous, and thus simplifies the assembly of the connector part 4.

The signal contraction carrier 43 is fixedly connected to the load contact carrier 44 and is secured in relation to the housing part 40 by way of the load contact carrier 44. The signal contact carrier 43, as described, passes with the fixing elements 431 thereof through the associated through-openings 414 in order to act on the contact elements 42. In addition, the load contact carrier 44 passes through slot-shaped through-openings 418 associated with through-ribs 443, as is apparent from FIG. 16 in conjunction with FIGS. 11 and 14, for example. In this way, the circuit board 41 is, at least during assembly, mounted on the signal contact carrier 43 and the load contact carrier 44 in an axially floating manner, wherein the circuit board 41 is held elastically in position in the housing part 40 by way of the contact springs 412, 413, 415 on both sides of the circuit board 41.

For mounting the connector part 4, the circuit board 41 is inserted together with the signal contact carrier 43 and the load contact carrier 44 into the receiving space 404 of the housing part 40 in such a way that the circuit board 41 bears with the contact springs 415 against the ends 421 of the contact elements 42. During assembly, the circuit board 41, under elastic preloading of the contact springs 412, 413, 415, thus assumes an intermediate position between the contact elements 42 on the one hand and the contact elements 45, 46 on the other hand so that the circuit board 41 is held axially in position under elastic preloading of the contact springs 412, 413, 415. Due to the elasticity of the contact springs 412, 413, 415, it is possible to compensate for tolerances in the material thickness of the circuit board 41, which makes the assembly of the connector part 4 insensitive to tolerances.

After assembly, the circuit board 41 is secured inside the receiving space 404 by way of fastening domes 405 arranged on the housing part 40 by securing the fastening domes 405, and thereby securing the circuit board 41 in relation to the housing part 40.

Since the circuit board 41 extends perpendicularly to the direction of extension of the contact elements 42, 45, 46, 47 in the receiving space 404 of the housing part 40, an installation space-efficient arrangement of the circuit board 41 in the housing part 40 is achieved, with additionally simple assembly of the connector part 4 and reliable thermal and/or electrical contacting with the associated contact elements 42, 45, 46. In particular, the circuit board 41 also makes it possible to create a preassembled structural unit, within the scope of which, in particular, connecting lines 420 can be premounted on the circuit board 41. The need for directly connecting the connecting lines 420 to associated contact elements 42, for example by crimping, is dispensed with.

The idea underlying the invention is not limited to the exemplary embodiments described above but can in principle be realized in a completely different manner.

A connector part of the type described here can advantageously be used in a charging system for charging an electric vehicle. The connector part can implement a charging socket (as in the illustrated exemplary embodiments) or a charging plug.

However, a different use is also conceivable. In principle, a connector part of the type described can be used wherever temperature monitoring on contact elements is desirable.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Vehicle
2 Charging station
3 Charging cable
30, 31 Charging plug
4 Connector part
40 Housing part
400 Plug-in face
401-403 Plug-in domes
404 Receiving space
405 Fastening domes
41 Circuit board
410, 411 Opening
412, 413 Contact spring
414 Through-opening
415 Contact spring
416 Resistor
417 Temperature sensor
418 Through-opening
42 Signal contacts
420 Connecting line
421 End
43 Signal contact carrier
430 Surface section
431 Fixing elements
44 Load contact carrier
440 Receiving device
441 Receiving groove
442 Recess
443 Through-ribs
45 Load contacts
450 Socket section
451 Shank section
452 Collar
453 Connection end
46 Ground contact (PE contact)
47 Signal contact
E Plug-in direction

What is claimed is:

1. A connector part for connecting, in a plug-in manner, to an associated mating connector part, comprising:
a housing part;
a plug-in face which is formed on the housing part and by which the connector part is connectable, in a plug-in manner, to the mating connector part and on which a plurality of contact elements configured to electrically connect to the mating connector part are arranged; and a circuit board, on which at least one electrical or electronic functional component is arranged, the circuit board having a first opening through which a first contact element of the plurality of contact elements extends, the circuit board comprising at least one first contact spring for the thermal and/or electrical contact with the first contact element and at least one second contact spring for the thermal and/or electrical contact with a second contact element of the plurality of contact elements.

2. The connector part according to claim 1, wherein the at least one first contact spring and the at least one second contact spring are arranged on different sides of the circuit board.

3. The connector part according to claim 1, wherein the first contact element comprises a load contact configured to transmit a load current.

4. The connector part according to claim 1, wherein the at least one first contact spring thermally connects the first contact element to the circuit board, the circuit board comprising a temperature sensor configured to detect heating at the first contact element.

5. The connector part according to claim 1, wherein the second contact element comprises a signal contact configured to transmit control signals.

6. The connector part according to claim 1, wherein the at least one second contact spring electrically connects the second contact element to the circuit board, the circuit board comprising an electrical resistor configured to provide resistor coding.

7. The connector part according to claim 1, wherein the at least one second contact spring electrically connects the second contact element to the circuit board, at least one connecting line being connected to the circuit board and electrically connected to the second contact element via the at least one second contact spring.

8. The connector part according to claim 1, wherein the circuit board has a second opening through which a third contact element extends, the circuit board comprising at least one third contact spring for the thermal and/or electrical contact with the third contact element.

9. The connector part according to claim 8, wherein the third contact element comprises a ground contact.

10. The connector part according to claim 8, wherein the at least one third contact spring electrically connects the third contact element to the circuit board, the circuit board connecting the second contact element and the third contact element to one another via an electrical resistor to provide resistor coding.

11. The connector part according to claim 1, further comprising by a signal contact carrier, which passes through the circuit board at a first through-opening to fix the second contact element on the housing part.

12. The connector part according to claim 1, further comprising a load contact carrier, which is connected to the housing part and on which the first contact element is arranged.

13. The connector part according to claim 12, wherein the load contact carrier passes through the circuit board at a second through-opening.

14. A connector part for connecting, in a plug-in manner, to an associated mating connector part, comprising:

a housing part;

a plug-in face which is formed on the housing part and by which the connector part is connectable, in a plug-in manner, to the mating connector part and on which a plurality of contact elements configured to electrically connect to the mating connector part are arranged; and a circuit board, on which at least one electrical or electronic functional component is arranged, the circuit board having a first opening through which a first contact element of the plurality of contact elements extends, the circuit board comprising at least one first contact spring for the thermal and/or electrical contact with the first contact element and at least one second contact spring for the thermal and/or electrical contact with a second contact element of the plurality of contact elements, wherein the first contact spring comprises a shank section passing through the first opening of the circuit board and a collar arranged on the shank section, the at least one first contact spring thermally and/or electrically contacting the collar of the first contact element.

15. The connector part according to claim 14, wherein the circuit board is elastically resiliently held in position by the at least one first contact spring and the at least one second contact spring between the collar of the first contact element and one end of the second contact element.

* * * * *